United States Patent [19]

Sako et al.

[11] Patent Number: 4,881,232
[45] Date of Patent: Nov. 14, 1989

[54] METHOD AND APPARATUS FOR ERROR CORRECTION

[75] Inventors: Yoichiro Sako; Shinichi Yamamura, both of Tokyo, Japan

[73] Assignee: Sony Corporation, Tokyo, Japan

[21] Appl. No.: 152,472

[22] Filed: Feb. 5, 1988

[30] Foreign Application Priority Data

Feb. 10, 1987 [JP] Japan .................. 62-029351

[51] Int. Cl.$^4$ .................................. G06F 11/10
[52] U.S. Cl. ........................ 371/37.4; 371/40.1
[58] Field of Search .................. 371/37, 38, 39, 40

[56] References Cited

U.S. PATENT DOCUMENTS

| | | | |
|---|---|---|---|
| 4,564,945 | 1/1986 | Glover et al. | 371/38 |
| 4,606,026 | 8/1986 | Baggen | 371/39 |
| 4,698,810 | 10/1987 | Fukuda et al. | 371/38 |
| 4,750,178 | 6/1988 | Sako et al. | 371/37 |
| 4,760,576 | 7/1988 | Sako | 371/40 |
| 4,785,451 | 11/1988 | Sako et al. | 371/37 |
| 4,788,685 | 11/1988 | Sako et al. | 371/38 |
| 4,819,236 | 4/1989 | Sako et al. | 371/38 |

Primary Examiner—Charles E. Atkinson
Attorney, Agent, or Firm—Lewis H. Eslinger; Jay H. Maioli

[57] ABSTRACT

An error-correcting method and apparatus for a block of data provided with an error-correcting parity for error correction and an error-checking parity that can be used to generate a syndrome for error-checking, in which error correction is carried out by the use of the error-correcting parity and then an error check is carried out by the use of the error-checking parity thereby to increase the reliability of the error-checking data, wherein error information produced by the error-correction process using the error-correcting parity is utilized to correct the syndrome used in the error-checking process, so as to execute the respective operations in parallel and reduce the required data processing time or through-put.

13 Claims, 4 Drawing Sheets

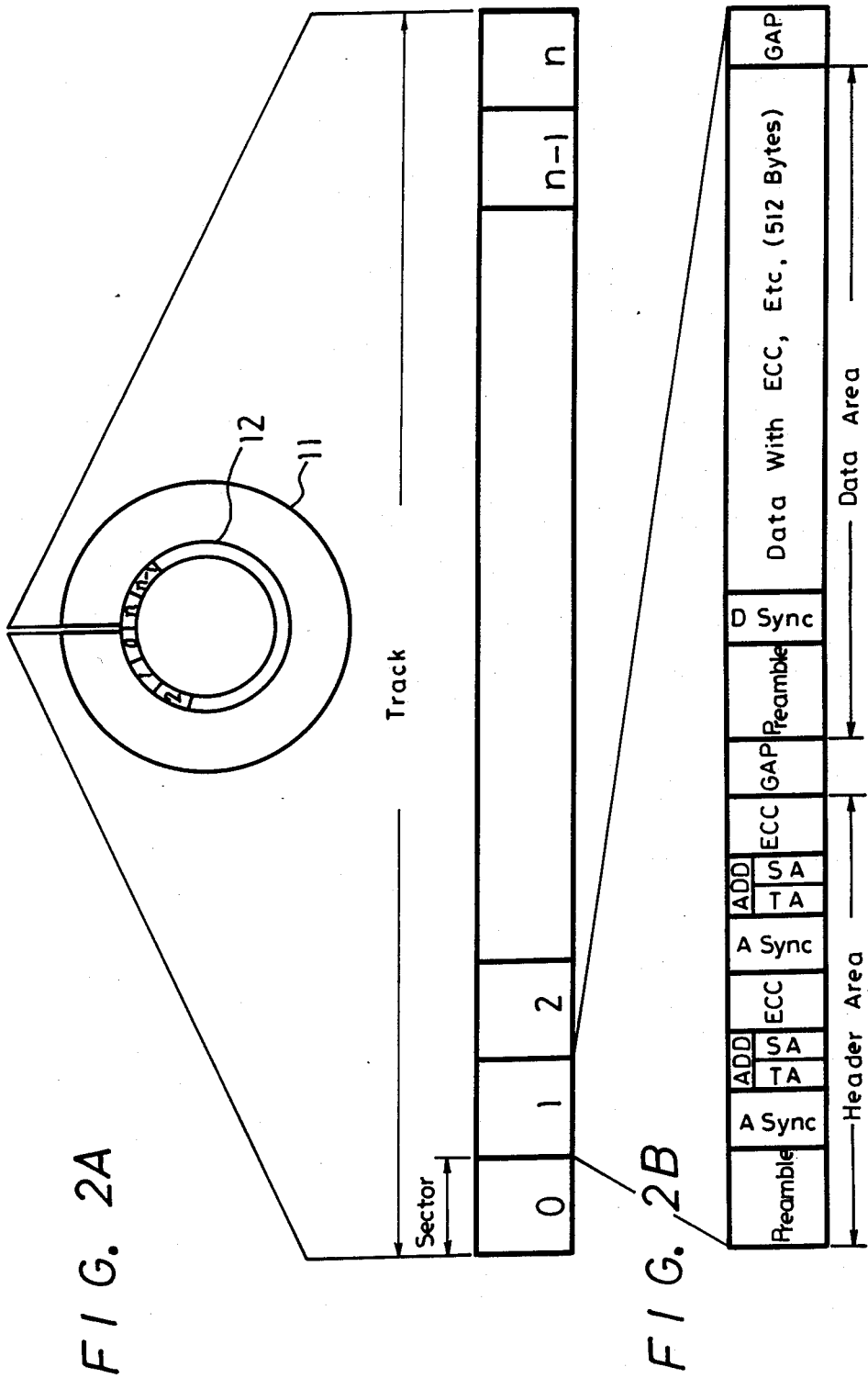

METHOD AND APPARATUS FOR ERROR CORRECTION

BACKGROUND OF THE INVENTION

1. Field of the Invention

This invention relates generally to a method and apparatus for error correction and, more particularly, to a method and apparatus suitable for faithfully and accurately reproducing data from each sector of a track on a disk-shaped recording medium, such as a magneto-optic disk.

2. Description of the Prior Art

There is already known a technique by which digital data is recorded on, and reproduced from, a disk-shaped record medium, such as an optical disk, a hard magnetic disk, or the like. In general, digital data is recorded and reproduced along with some sort of error-correcting parity that serves to detect and correct data errors that might possibly occur during recording or reproduction. In such cases, a block-completion type data format is usually employed in which an error-correcting parity is produced for a predetermined number of the data samples in the block.

In addition, magneto-optic disks are now being used as a record medium. These are so-called erasable discs in which a laser is used to alter the magnetization of a magnetic layer exhibiting perpendicular anisotropy, for example, as described in U.S. Pat. No. 4,610,009.

In the case where the data is intended for use in a computer, such data cannot be used at all unless it is correct and the user has faith in its accuracy. Thus, a parity code for checking error is also added to the data on a block unit basis to check whether errors occur in the data and thereby to improve the fidelity of the data.

FIG. 1 represents an example of such a data block, in which digital data is arranged in a memory in matrix form having m bytes in the row direction and n bytes in the column direction. A (k, m) code is produced for each element of m-byte data arranged in the row direction and k-m error detecting and correcting parities $C_1$ are added to each of the data blocks in the row direction. Similarly, an (1, n) code is produced for each element of n-byte data arranged in the column direction and l−n error detecting and correcting parities $C_2$ are added to each of the data blocks in the column direction. The two error detecting and correcting parities, $C_1$ and $C_2$, form a product code.

In the product code represented in FIG. 1, there is introduced into the last row of the data block, an error-checking parity or error-detecting code (EDC) for a final check as to whether or not the data blocks contain errors. The error-checking parity EDC is produced by sequentially reading the data from the uppermost row to the lowermost row and along the row direction.

Assuming in the above product code that the data read/write direction is in the row direction, error correction is effected first for the data block on each row by the use of the parity $C_1$ and next for the data block on each column by the use of the parity $C_2$. Errors can be gradually reduced by subsequently repeating the error-correcting process, however, if the error correction is performed to the limit of the error-correcting ability, there is the fear that the fidelity of the data may be degraded and, also, the required processing time becomes increasingly longer. For this reason, it is usually the case that continued repetitions of the error-correcting operation are stopped after a suitable number, and error-checking of the block of data, for which the error correction has been carried out, is effected by use of the error-checking parity EDC.

In the error-correcting process, as well in the error-checking process after error correction, as mentioned above, the reproduced data is temporarily written into a buffer memory in the form of the matrix represented in FIG. 1. The written data is then sequentially read out from the buffer memory along the row direction, and the error correction is effected by the use of the parity $C_1$. After this error correction is finished, the data is sequentially read out in the column direction, while effecting the error correction using the parity $C_2$. It has been found that it is possible to correct almost all errors by repeating the error correction process using the two parities $C_1$ and $C_2$.

When the error-correcting process is finished, the data is again sequentially read out from the buffer memory along the row direction to effect the error-checking process by using the error-checking parity EDC. Thus, it is necessary once again to read the data from the buffer memory for the error check after the error correction, so that the processing time is further prolonged. This is a disadvantage in this error-correction process, which needs to read data from a memory a large number of times.

OBJECTS AND SUMMARY OF THE INVENTION

Accordingly, it is an object of the present invention to provide a method and apparatus for improving the through-put of the error-correction signal processing.

It is another object of the present invention to provide a method and apparatus that substantially improve the signal processing speed by reducing the number of times that data is read out from a memory.

According to a first aspect of the invention, there is provided an error-correcting method for checking whether or not an error occurs in a block of data that have been provided with an error-correcting parity for correcting an error and with an error-checking parity for checking the presence of an error by first effecting an error-correcting process using the error-correcting parity and next effecting an error-checking process using the error-checking parity. This error-correcting method comprises the steps of:

(a) producing an error-correcting syndrome during the error-correcting process;

(b) producing an error-checking syndrome at the time the error-correcting syndrome is produced; and (c) amending the error-checking syndrome on the basis of error information produced during the error-correcting process, whereby a final error-checking syndrome will have been produced by the time the error-checking process is completed and will be available to control the data output.

According to a second aspect of the invention, there is provided an error-correcting apparatus for checking whether an error occurs in a block of data to which has been added an error-correcting parity for correcting an error and an error-checking parity for checking an error by first effecting an error-correcting process using the error-correcting parity and next effecting an error-checking process using the error-checking parity. This apparatus comprising:

(a) an error-correcting syndrome generator for producing an error-correcting syndrome for an error-correcting operation;

(b) an error-checking syndrome generator for producing an error-checking syndrome for an error-checking operation;

(c) a detector for determining error information including an error location and an error value on the basis of the error-correcting syndrome produced by the error-correcting syndrome generator and for correcting an error based on the error information; and (d) a syndrome modification circuit for amending an error-checking syndrome produced by the error-checking syndrome generator on the basis of the error location and the error value, whereby a final error-checking syndrome for the error-checking operation will have been produced at the time the error-correcting process is finished.

These and other objects, features, and advantages of the present invention will become apparent from the following detailed description of the preferred embodiment taken in conjunction with the accompanying drawings, throughout which like reference numerals designate like elements and parts.

BRIEF DESCRIPTION OF THE DRAWINGS

FIGS. 2A and 2B are representations of a data format used with a disk-shaped recording medium;

DETAILED DESCRIPTION OF A PREFERRED EMBODIMENT

In FIGS. 2A and 2B the data format of a magneto-optic disk is shown, in which data is recorded on a track 12 that is concentrically or spirally formed on a magneto-optic disk 11 with one track per rotation, and is available to be subsequently reproduced from track 12. Track 12 is formed of a plurality of segments or sectors of equal size in the circumferential direction and can comprise, for example, 32 sectors. On each sector there is recorded a predetermined amount of data with error-correcting and error-checking parities generated therefor. Each sector comprises a header area, a data area, and gap areas (GAP) provided behind each respective header and data area, as shown in FIG. 2B.

The header area is formed with a preamble signal or information at the beginning and following the preamble an address signal ADD, which consists of a track address data TA and a sector address data SA, an address synchronizing signal ASYNC, and an error-correcting parity ECC for the address signal are recorded twice.

The data area is formed with a preamble signal at its beginning and a data sync word DSYNC, followed by the data with an error-correcting parity ECC and an error-checking parity EDC and the like generated specifically for that data.

In the present embodiment, if disk 11 is to be used for computer storage then a unit amount of data to be recorded in the data area of one sector is assumed to be 512 bytes.

Figure 1:
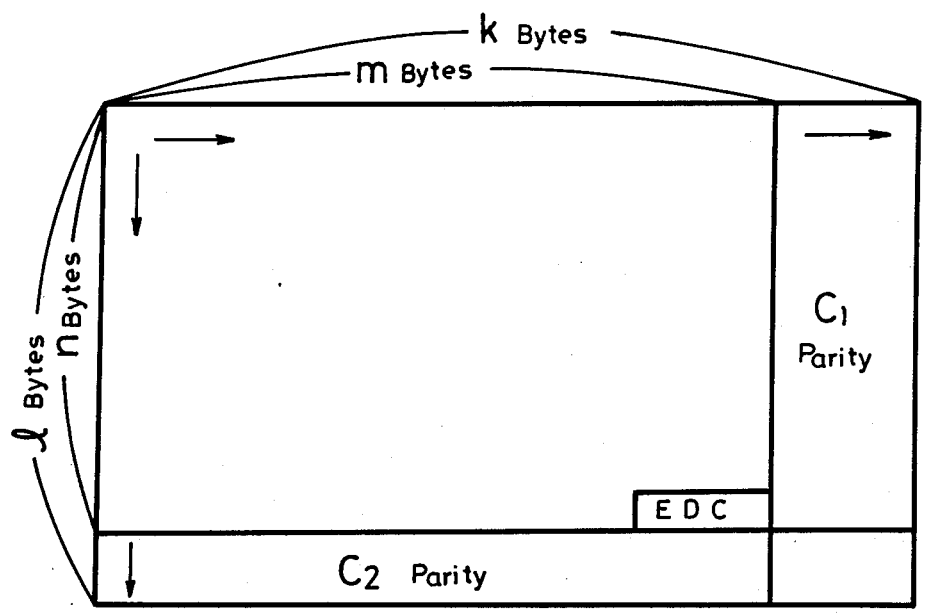
FIG. 1 is a representation of an arrangement of data and a product code in the form of a data block.
Figure 3:
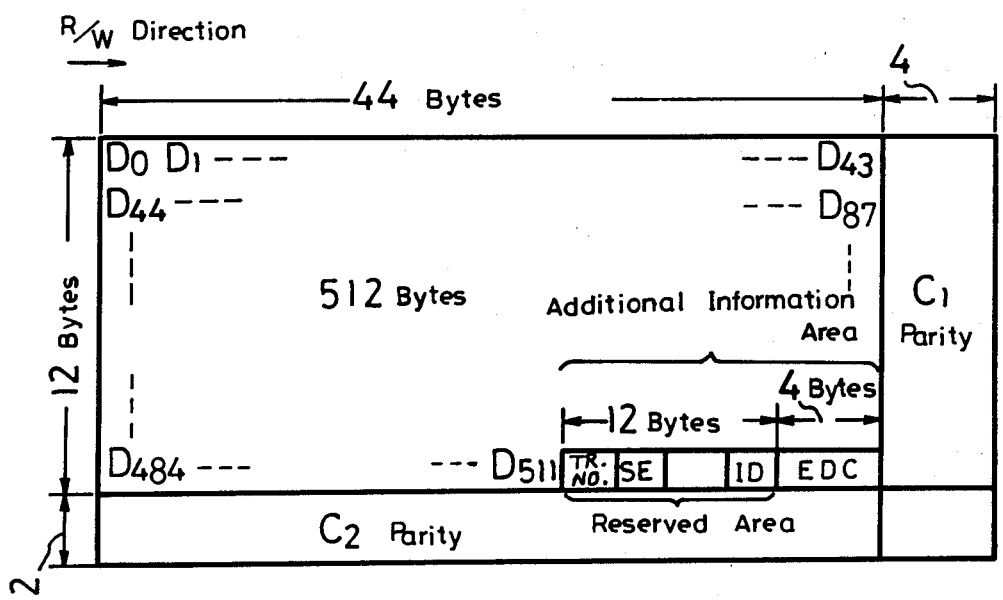
FIG. 3 is a representation showing data arranged in a data block.

The arrangement of the data area is shown in more detail in FIG. 3, in which there are 512 bytes of data, $D_0$ to $D_{511}$, recorded in the data area. In addition to the actual data, an additional information area of 16 bytes is added to data $D_0$ to $D_{511}$ to thereby form a matrix having 44 bytes in the row direction and 12 bytes in the column direction, that is, a total of 528 ($44 \times 12$) bytes of data. More specifically, a reserve of 12 bytes is provided immediately after the 512 bytes of data, $D_0$–$D_{511}$, for recording a track number, a sector number, data identification information, and the like. Following those 524 bytes of data, which include the reserve region, a 4-byte error-checking parity EDC in the row direction is provided and is allocated to the last 4-byte portion of this 16-byte additional information area. The 4-byte error-checking parity EDC can be a Reed-Solomon code, for example.

The 4-byte error-checking parity EDC is generated, taking $\alpha$ as the source of GF ($2^8$) (Galois Field), so as to satisfy the following equations:

$$\sum_{i=0}^{N} \alpha^{4i} D_i = 0 \quad (1)$$

$$\sum_{i=0}^{N} \alpha^{5i} D_i = 0$$

$$\sum_{i=0}^{N} \alpha^{6i} D_i = 0$$

$$\sum_{i=0}^{N} \alpha^{7i} D_i = 0$$

where N is 527 in this example.

Then, 4 bytes of a first error-correcting code, for example, a (48, 44) Reed-Solomon code, which is the parity code $C_1$, is added to each row of the 12 rows of the 528-byte data matrix, which includes the 4 bytes of the error-checking parity EDC. In the same manner, 2 bytes of a second error-correcting code, for example, a (14, 12) Reed-Solomon code, which is the parity code $C_2$, are added to each of the 44 columns of the matrix.

Thus, a data block comprising 528 bytes is formed of 512 bytes of data, with 16 bytes of additional information relative to that data, and is arranged in a matrix of 12 rows and 44 columns. The parities $C_1$ and $C_2$ are generated and respectively added to each of the rows and columns to form a product code, which is recorded as one sector of the disk.

Figure 4:
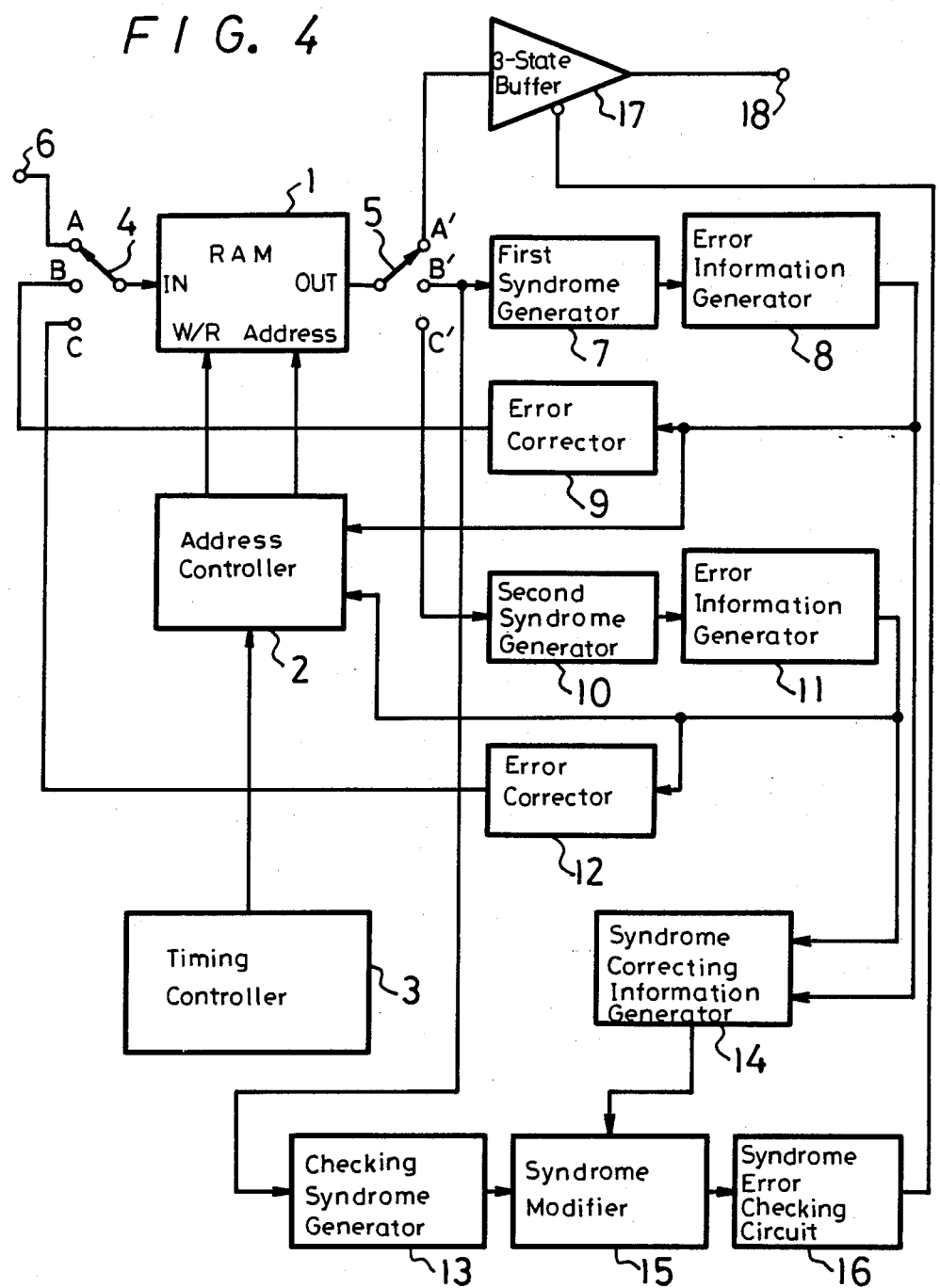
FIG. 4 is a schematic in block diagram form of an embodiment of the present invention.

Am embodiment of apparatus according to this invention by which the error-correcting and error-checking processes are effected on the above-mentioned data block is shown in FIG. 4 in block diagram form. A RAM 1 is used for storing or buffering data and the read and write timing of RAM 1 is controlled by a timing controller 3, which functionally is a microcomputer. An address controller 2 is provided in conjunction with RAM 1 to provide write/read commands and address information at respective inputs on RAM 1. Switches 4 and 5 are respectively provided at the input and output sides of the RAM 1 and controlled by a change-over signal from timing controller 3. When the data reproduced from magneto-optic disk 11 is to be written into RAM 1, switch 4 is changed over to input contact A. Then, the data that was reproduced from the magneto-optic disk 11 and converted to a digital signal is supplied through an input terminal 6 and switch 4 to a data input terminal IN of RAM 1. In this case, the data from disk 11 is reproduced on a sector unit basis, as shown in FIG. 2A, for example, and this data is formed in a block, as shown in FIG. 3. RAM 1 is placed in a write-enable condition by a write/read control signal generated from address controller 2, so that the reproduced data can be sequentially written into RAM 1 based on a write-addresses specified by address controller 2. Thus, a block of data in the form of the matrix shown in FIG. 3 is formed in the memory (RAM).

When this data writing process has been completed, error correction is first carried out and then error check is next effected. In this case, the error correction can be effected such that an error correction using the parity $C_1$ and an error correction using the parity $C_2$ are sequentially repeated, with the final error correction using the parity $C_2$. According to this invention, when the error correction using the parity $C_1$ is repeated at a predetermined time, for example, during the final error correction sequence, an error-checking syndrome is also produced at such time.

In performing the error corrections using the parities $C_1$ and $C_2$, switches 4 and 5 are respectively connected to contacts B and B' for the error correction using the parity $C_1$. Data stored in RAM 1 is read out along the row direction, as shown in FIG. 3, and supplied through switch 5 to a first syndrome generator 7 that generates a syndrome for each row of the data matrix shown in FIG. 3. If the data contains an error, a detecting circuit 8 detects the relevant information concerning that error, that is, its location and value. The information on the error location and the error value is supplied to an error corrector 9 to correct the corresponding error. The data indicative of the error location from error information generator 8 is also supplied to address controller 2, so that the error data in each of the rows of the data matrix in RAM 1 can be pointed out by the address signal generated by address controller 2 and replaced with correct data supplied from error corrector 9.

After the error correction using the parity $C_1$ has been completed, the error correction using the parity $C_2$ is then effected. Switches 4 and 5 are connected to contacts C and C', respectively, and data stored in matrix form in RAM 1 is read out along the column direction and supplied through switch 5 to a second syndrome generator 10, wherein a syndrome is produced for each column of the data matrix shown in FIG. 3. If that data contains an error, an error information generator 11 generates the relevant information about the error, that is, its location and value. In the preceding operation, an error flag may be added to a row in which an error could not be corrected by the use of parity $C_1$ and such error referred for error correction using the parity $C_2$.

The information on the error location and the error value is supplied to an error corrector 12 to correct the erroneous data. The data indicative of the error location is also supplied to address controller 2, so that the errors in the columns of the data matrix can be pointed out by address signals generated from address controller 2 and replaced with correct data supplied from error corrector 12.

The error corrections using the parities $C_1$ and $C_2$ are repeated a predetermined number of times, and the error-checking syndrome is produced during the last cycle of error corrections using the parities $C_1$ and $C_2$.

This error-checking syndrome is produced as follows. When performing error correction using the parity $C_1$, switches 4 and 5 are connected to the contacts B and B', respectively, to read out the data from RAM 1 along the row direction of the data matrix that is configured as represented in FIG. 3. The data thus read out is supplied to first syndrome generator 7 and also to a checking syndrome generator 13. Thus, at the time the error correction is effected on each row the error-checking syndrome can be simultaneously produced. When all the data has been read out from RAM 1, the error-checking syndrome generation will also be finished, however, this error-checking syndrome may include some errors, because it is based upon data that is obtained before error correction using the parity $C_1$ has been effected. If the correct error-checking syndrome S is expressed by:

$$S = \begin{pmatrix} S_4 \\ S_5 \\ S_6 \\ S_7 \end{pmatrix} \quad (2)$$

the actually produced syndrome S' is:

$$S' = \begin{pmatrix} S_4' \\ S_5' \\ S_6' \\ S_7' \end{pmatrix} = \begin{bmatrix} \alpha^{4j}ej \\ \alpha^{5j}ej \\ \alpha^{6j}ej \\ \alpha^{7j}ej \end{bmatrix} + \begin{bmatrix} \alpha^{4k}ek \\ \alpha^{5k}ek \\ \alpha^{6k}ek \\ \alpha^{7k}ek \end{bmatrix} + \ldots + \begin{bmatrix} S_4 \\ S_5 \\ S_6 \\ S_7 \end{bmatrix} \quad (3)$$

where j, k ... represent error locations ej, ek ... represent error values, and $S_4$, $S_5$, $S_6$ and $S_7$ represent the syndromes. Thus, if $\alpha^{aj}ej$ and $\alpha^{ak}ek$ (a=4, 5, 6, 7) included in S' are calculated and added by modulo 2 addition with S', $\alpha^{aj}ej + \alpha^{aj}ej = 0$, whereby S=S' is established and accordingly the original error-checking syndrome that was generated is corrected to become a correct error-checking syndrome.

Thus, the correct error-checking syndrome can be obtained by executing the following operations:

Upon performing an error correction using the parity code $C_1$, the information on the error location and the error value detected by error information detecting circuit 8 is also supplied to a syndrome correcting information detector 14, wherein information for correcting the produced syndrome is generated on the basis of the error location and error value supplied thereto from error information generator 8. The information on the error location in the respective rows is converted to positional information relative to the data numbered $D_0$ to $D_{511}$ in the matrix. The above-mentioned error information $\alpha^{aj}ej$ and $\alpha^{ak}ek$ ... (a=4, 5, 6, 7) is calculated from the positional information and the error value. Then, the error information is supplied to a syndrome modifier 15 that also receives the error-checking syndrome produced by the error-checking syndrome generator 13. The syndrome modifier 15, which may comprise an exclusive OR, effects an addition of modulo 2, whereby the influence of the errors included in the syndrome as described above is removed. In other words, the error-checking syndrome is produced from data that has had its errors corrected by the use of the parity $C_1$.

When the error correction using the parity $C_2$ is next effected, the information on the error location and the error value detected by the error information detector 11 is also supplied to the syndrome correcting information generator 14, wherein error information is produced on the basis of the information relating to the error location and the error value. The error information thus produced is supplied to the syndrome corrector 15, wherein the influence of the errors included in the data is removed, also as described above. In other words, the error-checking syndrome is effectively produced from data which has had its errors corrected by the use of the parity $C_2$.

The error-checking syndrome, which has been corrected by syndrome modifier 15, is supplied to a syndrome error-checking circuit 16 to make certain that the errors have been removed therefrom. The output signal from the syndrome error-checking circuit 16 indicates the checking results and is supplied to an enable terminal of a buffer amplifier 17, which may comprise a so-called three state buffer. The signal enables amplifier 17 when the checking result of syndrome error-checking circuit 16 shows that all errors have been removed, and the signal also disables amplifier 17 when the checking result shows that some error still remains.

After the error-correcting and error-checking processes have been completed, switch 5 is connected to contact A' to read out the error-corrected data, however, if any errors still remain after the error-checking process, the data cannot pass through the buffer amplifier 17 and accordingly cannot arrive at the output terminal 18. Therefore, only data that is free from errors can be delivered to output terminal 18.

Alternatively, the data may be prevented from being read out from RAM 1 if the output from error-checking circuit 16 indicates the existence of a remaining error.

Figure 5:
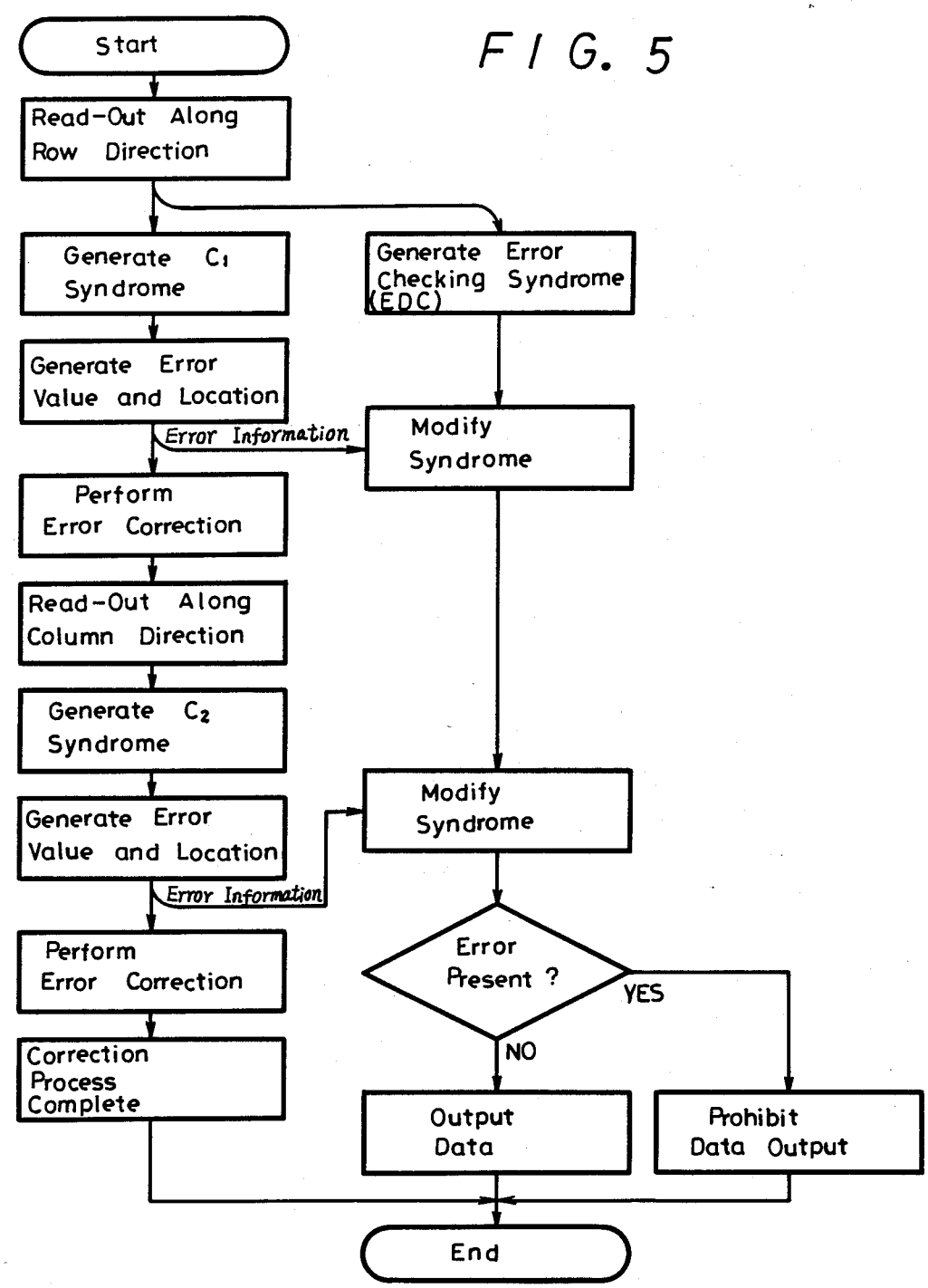
FIG. 5 is a flow chart useful in explaining error-correcting and error-checking operations according to the present invention.

FIG. 5 is flow chart of an example of the above-described error-correcting and error-checking operations where the error corrections using the parities $C_1$ and $C_2$ are each effected once. It will be noted after the first syndrome is generated based on parities $C_1$, that syndrome is modified and, subsequently, after the second syndrome is generated based on parities $C_2$ that syndrome is also modified based on the generated error value and location. In addition, although only one error correction cycle is shown in FIG. 5 it will be appreciated that any number of iterations of this process can be performed, with the error-checking syndrome being generated and modified if necessary on the last cycle of error-correcting.

In addition to the above-described embodiment a modification is possible in which the error-checking syndrome is produced the first time the error correction using the parity $C_1$ is effected and is amended on the basis of error values and locations generated during that first error correction, so that when error correction using the parity $C_1$ is performed the second time, the error-checking syndrome is not produced but the previously produced error-checking syndrome is modified based on error values and locations generated during the second error correction. Of course, the error-checking syndrome is also amended based on the error information derived from error locations and error values generated during the error correction using the parity $C_2$.

As described above, the error-checking syndrome is simultaneously produced when the error corrections using the parity $C_1$, which was added to the data arranged in the respective rows, and parity $C_2$, which was added to the data arranged in the respective columns, are effected for the last time. Nevertheless, in an alternative embodiment the error-checking syndrome may be produced at the same time error correction using the parity $C_1$ is effected for the first time or at some other arbitrary time. In another alternate embodiment, the error-checking syndrome can be produced and modified based solely on the error information relating to the error locations and error values generated during the error correction using the parity $C_1$, as well as on the basis of error locations and error values generated during the error corrections using both parities $C_1$ and $C_2$.

The error-checking parities are not limited to the above-mentioned Reed-Solomon codes, and other error detecting codes and error-correcting codes, such as a CRC (cyclic redundancy check) code, may be employed.

According to the present invention, in the event that a block of data, which includes an error-correcting parity for correcting an error and an error-checking parity for checking an error, is subjected to error correction using the error-correcting code and then to error check using the error-checking parity so as to elevate the fidelity of the data whose error is corrected, an error-checking syndrome is produced simultaneously with the error correction using the error-correcting parity and is then modified on the basis of the error information (error locations and error values) generated during the error correction using the error-correcting parity. In this way, a final error-checking syndrome has already been produced at the time the error-correcting process is finished, so that it is not necessary to provide a further process for producing the error-checking syndrome after the error-correcting process is finished, whereby the error correction through-put or signal processing rate can be improved.

The above description is given on a single preferred embodiment of the present invention but it will be apparent that many modifications and variations could be effected by one skilled in the art without departing from the spirit or scope of the novel concepts of the invention so that the scope of the invention should be determined by the appended claims only.

What is claimed is:

1. An error-correcting method for checking whether an error occurs in a predetermined data arrangement that includes an error-correcting parity for correcting an error by effecting an error-correcting process by the use of said error-correcting parity and an error-checking parity for checking an error by effecting an error-checking process by the use of said error-checking parity, said error-correcting method comprising the steps of:
   (a) producing an error-correcting syndrome using said error-correcting parity during said error-correcting process;
   (b) producing an error-checking syndrome substantially simultaneously with said producing of said error-correcting syndrome; and
   (c) amending said error-checking syndrome on the basis of error information produced during said error-correcting process, whereby an amended error-checking syndrome is finally produced by the time the error-correcting process is completed.

2. An error-checking method according to claim 1, wherein said error-checking parity is produced on the basis of a cyclic redundancy check (CRC) code.

3. An error-checking method according to claim 1, wherein said error-correcting parity is produced on the basis of a Reed-Solomon code.

4. An error-checking method according to claim 1, wherein said error information includes error location and error value.

5. An error-checking method according to claim 1, wherein a second error-correcting parity is added to respective data arranged in a second direction different than said predetermined direction, and said error-checking syndrome is amended using error information based upon an error-correcting syndrome produced using said second error-correcting parity.

6. An error-checking method according to claim 5, wherein said predetermined direction is the row direction and said second direction is the column direction in said block of data.

7. An error-correcting method for checking whether an error occurs in a block of data formed of a predetermined number of data and error-checking parities for checking the presence of an error in said predetermined number of data, said block of data including error-correcting parities for respective data arranged in a predetermined direction by effecting an error-correcting process using said error-correcting parities, said method comprising the steps of:
   (a) producing an error-correcting syndrome for respective data arranged along said predetermined direction of said block of data;
   (b) producing an error-checking syndrome during the step of producing said error-correcting syndrome; and
   (c) amending said error-checking syndrome using error information based upon said error-correcting syndrome produced during said error-correcting process, whereby an amended error-checking syndrome for use in a subsequent error-checking process is produced by the time the error-correcting process is completed.

8. An error-checking method according to claim 7, wherein said error-checking parity is produced on the basis of a cyclic redundancy check (CRC) code.

9. An error-checking method according to claim 7, wherein said error-correcting parity is produced on the basis of a Reed-Solomon code.

10. An error-checking method according to claim 7, wherein said error information includes error location and error value.

11. An error-correcting apparatus for checking whether an error occurs in a predetermined array of data including an error-correcting parity for correcting an error by effecting an error-correction process using said error-correcting parity and an error-checking parity for checking the presence of an error by first effecting an error-checking process using said error-checking parity, said apparatus comprising:
   (a) error-correcting syndrome producing means for producing from said error-correcting parity an error-correcting syndrome for correcting data errors;
   (b) error-checking syndrome producing means for producing from said error-checking parity an error-checking syndrome for checking the presence of data errors;
   (c) error-correcting means receiving the array of data for calculating an error location and an error value therein on the basis of said error-correcting syndrome produced by said error-correcting syndrome producing means and for correcting an error; and
   (d) syndrome amending means for amending an error-checking syndrome produced by said error-checking syndrome producing means on the basis of said error location and said error value, whereby as amended error-checking syndrome for the error-checking operation is produced by the time the error-correcting process is finished.

12. An error-correcting apparatus for checking whether an error occurs in a two-dimensional data array formed of a predetermined number of data and an error-checking parity for checking the presence of an error in said predetermined number of data, said data array including error-correcting parities added to respective data arranged in a predetermined direction, by effecting an error-correcting process using said error-correcting parities and effecting an error-checking process using said error-checking parity, said apparatus comprising:
   (a) error-correcting syndrome producing means for producing an error-correcting syndrome for respective data arranged in said predetermined direction of said two-dimensional data array;
   (b) error-checking syndrome producing means for producing an error-checking syndrome based on data supplied to said error-correcting syndrome producing means for producing said error-correcting syndrome;
   (c) error-correcting means receiving the data array for determining an error location and an error value therein on the basis of the error-correcting syndrome produced by said error-correcting syndrome producing means and for correcting an error; and
   (d) syndrome amending means for amending the error-checking syndrome produced by said error-checking syndrome producing means whereby a final error-checking syndrome for the error-checking process has been produced at the time the error-correcting process is completed.

13. An error-correcting apparatus according to claim 12, further comprising:
   (a) second error-correcting syndrome producing means receiving the data array for producing a second error-correcting syndrome for respective data arranged in a second direction different than said predetermined direction, said second error-correcting syndrome being based on a second error-correcting parity for respective data in said second direction and for correcting an error thereof; and
   (b) second error-correcting means for calculating an error location and an error value on the basis of the second error-correcting syndrome produced by said second error-correcting syndrome producing means and correcting errors, whereby said syndrome amending means also receives said error location and error value from said second error-correcting means and said error-checking syndrome is amended also on the basis of error location and the error value derived by said second error-correcting means.

* * * * *